United States Patent [19]
Jericevic et al.

[11] Patent Number: 5,757,852
[45] Date of Patent: May 26, 1998

[54] METHOD FOR COMPRESSION OF HIGH RESOLUTION SEISMIC DATA

[75] Inventors: Zeljko Jericevic; Gary A. Sitton, both of Houston, Tex.

[73] Assignee: Western Atlas International, Inc., Houston, Tex.

[21] Appl. No.: 787,310

[22] Filed: Jan. 24, 1997

[51] Int. Cl.$^6$ .................................................. H04B 1/66
[52] U.S. Cl. ........................... 375/240; 348/384; 382/232
[58] Field of Search ..................................... 375/240, 241; 370/477; 348/384; 358/426; 382/232, 244, 250; 381/2.1; 364/715.02

[56] References Cited

U.S. PATENT DOCUMENTS

| | | | |
|---|---|---|---|
| 4,903,317 | 2/1990 | Nishihara et al. | 358/426 |
| 5,432,871 | 7/1995 | Novik | 382/232 |

FOREIGN PATENT DOCUMENTS

| | | |
|---|---|---|
| 2305277 | 4/1997 | United Kingdom. |

OTHER PUBLICATIONS

"Image Compression Methods With Distortion Controlled Capabilities" Markas et al. IEEE, pp. 93–101, 1991.

*Primary Examiner*—Temesghen Ghebretinsae
*Attorney, Agent, or Firm*—Richard A. Fagin

[57] ABSTRACT

A method of compressing digital signals for transmission and/or storage. The method includes lossy compressing the digital signal to generate a lossy compressed signal. The compressed signal is decompressed locally to generate a local lossy decompressed signal. An error signal is calculated as the difference between the original digital signal and the local lossy decompressed signal. The power in the original digital signal and in the error signal is determined. A minimum resolution for quantizing the error signal is determined from a ratio of the power of the original signal with respect to power of the error signal. The error signals is lossy compressed by quantizing to at least the minimum resolution. Both the compressed digital signal and the compressed error signal are transmitted and/or stored. The lossy compressed error signal and the lossy compressed signal are recovered from storage or transmission. The lossy compressed signal and the lossy compressed error signal are decompressed, and the decompressed lossy compressed original signal and the decompressed lossy compressed error signal are summed to generate the recovered original digital signal.

15 Claims, 2 Drawing Sheets

METHOD FOR COMPRESSION OF HIGH RESOLUTION SEISMIC DATA

BACKGROUND OF THE INVENTION

1. Field of the Invention

The invention is related to the field of transmission and storage of digitized signals. More specifically, the invention is related to methods for compressing digitized signals so as to improve the speed with which the signals can be transmitted, or to reduce the volume of storage space needed to store the digitized signals.

2. Description of the Related Art

Signal compression techniques are commonly used to reduce the number of digital bits needed to represent a digitized signal. Compression techniques are valuable because they enable increased transmission speed of digital signals over a band limited communication channel, and they can reduce the volume of storage space needed to store digitized signals. Compression techniques known in the art can be generally described as either lossless or lossy.

Lossless compression techniques enable complete and exact recovery of the entire digital signal with no change in the signal, after a compression and decompression cycle, at any level of arithmetic significance. Each bit in the original digital signal can be precisely recovered using lossless techniques.

Lossless data compression is commonly performed by initially preprocessing the signal, using techniques such as differential coding or predictive coding. See for example, N. S. Jayant and P. Noll, *Digital Coding of Waveforms*, Prentice-Hall (1984). Then the preprocessed signal can undergo a procedure called byte- or bit-slicing, such as by a process described in, J. W. Schwartz et al, *Bit Plane Encoding: A Technique for Source Encoding*, IEEE Transactions on Aerospace and Electronic Systems, vol. AES-2, No. 4, July 1996. Alternatively, the digital signal can be processed by a lossless integer-to-integer wavelet based transform, such as one described in, A. Said and W. A. Pearlman, *An Image Multiresolution Representation for Lossless and Lossy Image Compression*, IEEE Transactions on Image Processing, vol. 5, (1996).

The result of the preprocessing step is then losslessly compressed using techniques such as run encoding, described for example in, T. C. Bell et al, *Text Compression*, Prentice-Hall (1990), or variable length integer encoding. See for example, W. B. Pennebaker et al, *JPEG Still Image Data Compression Standard*, Von Nostrand Reinhold, New York, 1993. Lossless compression is then typically followed by a so-called "entropy" encoding step, such as Huffman coding or Lempel-Zev dictionary coding. See for example J. Zev and A. Lempel, *Sequential Data Compression*, IEEE Transactions in Information Theory, vol. IT-23, no. 3, May 1977.

In order to restore the digital signal to its original form, the compressed signal must undergo decompression. At each stage in the process of decompressing a losslessly compressed signal, a corresponding compression stage is exactly reversed, i.e. entropy decoding reverses entropy coding, and postprocessing reverses preprocessing.

A limitation of purely lossless data compression is that the compression ratios, for most digitized signals associated with such operations as seismic exploration, tend to be limited to around 4:1 at best, and at worst to 1:1, i.e. no signal compression at all.

It is known in the art to improve the overall compression ratio by using so-called "lossy" signal compression techniques. Lossy compression techniques are not reversible in that upon decompression of a lossy compressed signal there typically will be some difference between the decompressed signal and the original signal. Most lossy signal compression techniques are made up of the same two processing steps as used in lossless compression techniques, but with additional preprocessing steps added in between.

One additional preprocessing step used in lossy compression typically is a virtually lossless, invertible and recoverable transformation, such as blocked discrete cosine transforms, described for example in, W. B. Pennebaker and J. L. Mitchell, *JPEG Still Image Data Compression Standard*, Von Nostrand Reinhold, New York (1993), or discrete wavelet transforms, described for example in, P. Antonini et al, *Image Coding Using Wavelet Transform*, IEEE Transactions on Image Processing, vol. 4, no. 2, Feb. 1992. Another additional step in lossy compression, however, involves a selective quantization of the transformed signal coefficients. For example, "lower frequency" image or signal coefficient values would be represented by more bits than would the "higher frequency" coefficient values. Because quantization is both nonlinear and is irreversible it is therefore termed "lossy".

The final result of the decompression of lossy compressed signals is not the original digital signal, but an approximate version of the original signal. The dequantization (inverse of quantizing) step used in the typical lossy decompression technique reconstructs truncated or numeric values by filling in the least significant bits, which were truncated in the process of lossy compression, with zeros.

The last step in lossy compression is typically the same as in the lossless compression example cited before. It is therefore only the quantization step that really differentiates the two classes of compression techniques. The preprocessing transformation which is used in signal compression affects the efficiency of either lossless or lossy compression, and for lossless compression the preprocessing transformation must be an exact and reversible process. In lossy compression, the preprocessing step can have some small loss of signal information, but only at a low enough level so as not to materially contribute to any significant signal distortion. Virtually all of the distortion, or loss, in lossy compression occurs in the quantization step.

Typically, signal compression for 2-dimensional signals, or images, has been limited to use in low-resolution or "presentation" images having 8-bits (a single byte) resolution for each monochrome image pixel (picture element) value. The advent of digital medical images (X-ray, MRI, etc.) has required increasing this resolution to a minimum of 10-bits and in some cases can have as much as 16-bit resolution.

Exploration seismic signal acquisition has standardized to a 24-bit integer format with the introduction of low cost 24-bit sigma-delta analog-to-digital (A/D) converters. These new higher resolution signals generally must be faithfully stored and recovered at or below the noise level of the acquisition instrument, typically about −100 dB for 24-bit resolution seismic signals. In practice, this noise level implies a minimum of 17 bits signal resolution, and an average of about 20 bits of resolution, wherein the remaining average of 4 bits are used for a sign bit and for high signal level over-ranging protection.

Another lossy compression scheme is described in U. S. Pat. No. 5,426,512 issued to Watson. The scheme described in the Watson '512 patent includes optimizing the step of quantization by preselecting an acceptable level of perceptual error for a particular data (bit) transmission rate or alternatively selecting acceptable bit rate for a particular perceptual error value. The compression technique described in this patent does not make use of the signal information contained in the error signal of the lossy compression technique and so may lose some of this information.

Most lossy image compression techniques are best suited for compressing lower-resolution (such as 8-bit) signals at compression ratios in the range of 10:1 to 100:1. For higher-resolution signals such as exploration seismic data, having 24-bits resolution, lossless compression can usually only provide an average of about 2:1 compression, as previously explained. There is a need for a low distortion (less than −100 dB) signal compression technique which is virtually lossless and has compression ratios approximately in the range between 2:1 to 10:1.

SUMMARY OF THE INVENTION

The invention is a method of compressing digital signals for transmission and/or storage. The method includes lossy compressing the original digital signal to generate a lossy compressed signal. The lossy compressed signal is decompressed locally, before storage or transmission, to generate a local lossy decompressed signal. An error signal is calculated as the difference between the original digital signal and the local lossy decompressed signal. The power in the original digital signal and in the error signal is then determined. A minimum resolution for quantizing the error signal is determined from a ratio of the power of the original signal with respect to power of the error signal. The error signals is lossy compressed with quantization to at least the minimum resolution. Both the compressed digital signal and the compressed error signal are transmitted and/or stored. The lossy compressed error signal and the lossy compressed signal are recovered from storage or transmission. The lossy compressed signal and the lossy compressed error signal are decompressed, and the decompressed, lossy compressed original signal and the decompressed, lossy compressed error signal are summed to generate the recovered original digital signal.

DESCRIPTION OF THE PREFERRED EMBODIMENT

Figure 1:
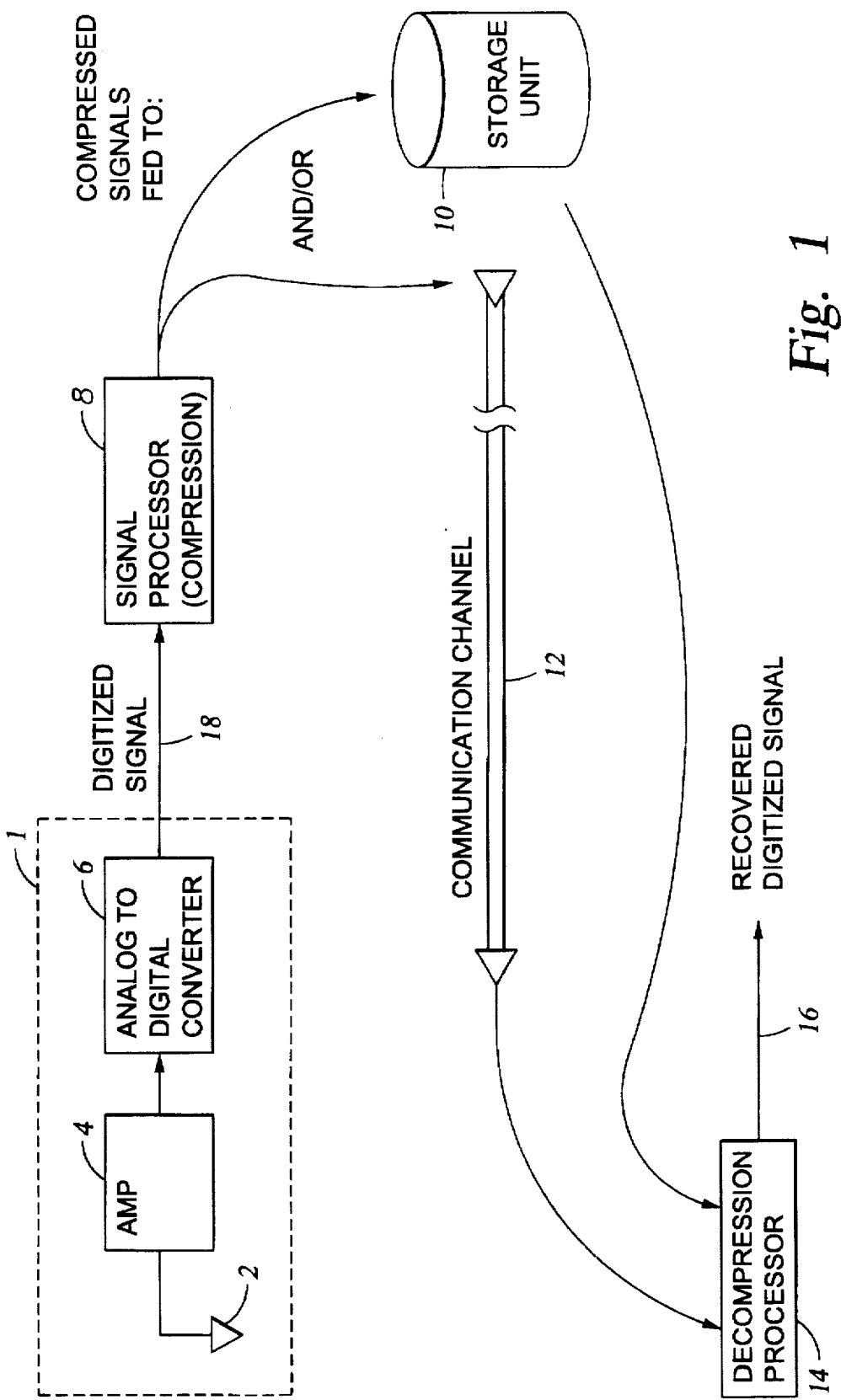
FIG. 1 shows a generalized representation of a signal digitization and transmission/storage system which uses signal compression.

A generalized representation of a signal storage and communication system which can use the process of this invention is shown in FIG. 1. A digital signal source 1 can include a sensor 2 such as geophones or hydrophones which convert acoustic energy into electrical signals. The sensor 2 is typically connected to some form of analog amplifier 4 which increases the magnitude of the signal generated by the sensor 2 so that the signal magnitude is within the dynamic range of an analog-to-digital converter (ADC) 6. The ADC 6 can be selected from types familiar to those skilled in the art including sigma-delta converters. The output of the ADC 6 typically consists of multiple-bit binary words representing the magnitude of the sensor signal output sampled at spaced apart time intervals. The output of the ADC 6 is shown in FIG. 1 as a digitized signal 18.

The process of the invention is particularly well suited to be used on digital signals when the source of the digital signals shown is a seismic data acquisition and recording system (which is the system represented in FIG. 1). Seismic signal data are typically recorded with 24-bit resolution ADC's, and the nature of digitized seismic signals is such that they can be effectively subjected to data compression. The signal source 1 shown in FIG. 1, however, is meant only to serve as an example of signal sources which can generate digitized signals for processing according to the method of the invention, and therefore the example source in FIG. 1 is not meant to limit the application of the invention. Other signal sources having outputs already in the form of digital words, and sensors other than geophones or hydrophones can also generate digitized signals which are useful with the process of the invention.

Typically the digitized signal 18 will be conducted to a signal processor 8 where the signal compression portion of the process of the invention can be performed. The signal processor 8 can be selected from, among other devices, any one of a number of well known microprocessors such as INTEL Corp. model 80486, or fully integrated digital signal processors such as Texas Instruments Inc. model TMS320C30.

The output of the signal processor 8 represents a compressed digitized signal compressed according to the process of this invention, as will be further explained. The compressed digitized signal can be conducted either to a storage device 10, or conducted to a communication channel 12 for transmission to a remote location. The storage device 10 can be any device capable of storing digitized signal data such as magnetic tape, magnetic diskettes of hard drives, semiconductor memory devices, etc. The communication channel 12 can be any device normally used for transmission of signals from one location to another and can include electrical cable and radio telemetry, as well as optical telemetry.

To recover the information contained in the compressed digitized signals, the compressed digitized signals can be retrieved from the storage unit 10 or can be received at the remote location on the communication channel 12, whereupon the compressed signal can be conducted to a decompression processor 14. The decompression processor 14 can be a microprocessor device similar to the signal processor 8, but it need not, in any event, be the identical processor device as is the signal processor 8. The process performed on the signals in the decompression processor 14 results in generation of a recovered digitized signal 16. The overall process of the invention provides a recovered decompressed signal 16 which more faithfully represents the digitized signal 18 while using fewer numbers of digital bits (higher compression ratio) to represent the compressed digitized signal during transmission and/or storage than do other signal compression methods which are not completely reversible ("lossy compression methods").

Figure 2:
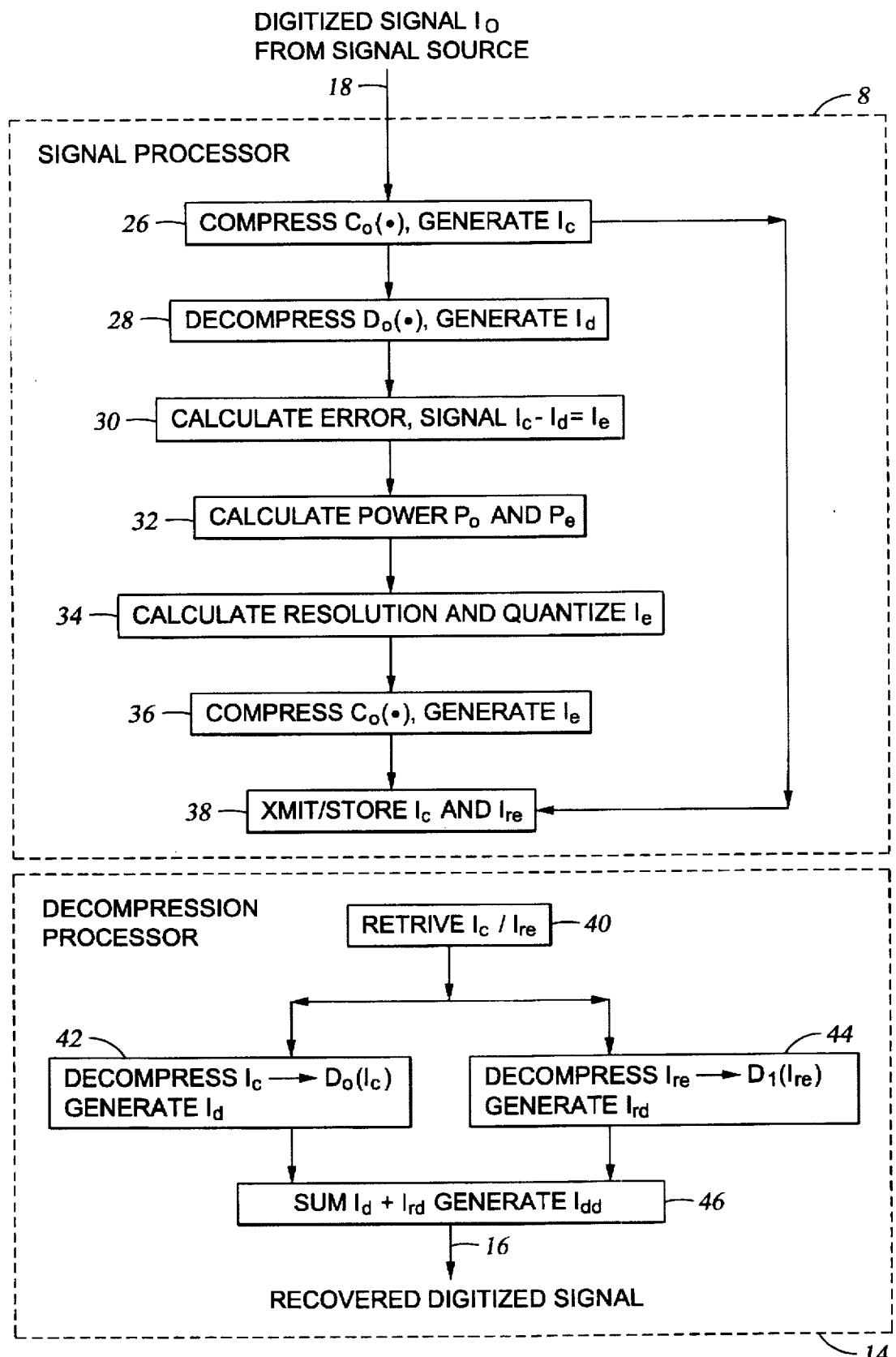
FIG. 2 shows a flow chart of the signal compression/decompression process of the invention.

A generalized description of the process of the invention can be better understood by referring to the flow chart in FIG. 2. In the signal processor 8, the digitized signal 18, represented by $I_o$, is compressed by means of a compression function $C_o(\cdot)$ to obtain a compressed signal $I_c$. This is shown at box 26 in FIG. 2. Using the same decompression function, designated by $D_o(\cdot)$, which is to be used in the decompression processor 14, the compressed signal $I_c$ is decompressed in the signal processor 8 to generate a locally decompressed signal $I_d$. This is shown at box 28. It is to be understood that the actual physical hardware component in which the local decompression takes place is not a limitation on the invention, rather, the local decompression may take place in another signal processing hardware component located where the compressed signal is applied to the communication channel 12 or to the storage device 10. The use of the locally decompressed signal $I_d$ and the compressed signal $I_c$ will be further explained.

Next, an error signal $I_e$ is calculated. The error signal is simply the arithmetic difference between the digitized signal 18 and the decompressed compressed signal $I_c$ and can be calculated by the expression:

$$I_e = I_o - I_d$$

as is shown at box 30 in FIG. 2.

Then the power values of the error signal and the digitized signal 18, $P_e$ and $P_o$ respectively, can be calculated. The power values can be calculated by the expression:

$$P_j = \Sigma[I_j(i,j)]^2 / M \times N.$$

as shown at box 32 in FIG. 2. M and N represent the number of pixels used to represent the signal. The signals described herein are 2-dimensional, but it is to be explicitly understood that the number of dimensions in the signals is not a limitation on the invention. The process of this invention is applicable to signals having any number of dimensions. As will be further explained, other measures of the relative information content in the error signal and in the digitized signal 18 can be substituted for the power, and so calculation of signal power is not meant to be an explicitly required step in the process of the invention.

When the power values are calculated, then a minimum resolution m for the error signal can be computed, and the error signal $I_e$ can be quantized:

$$m = \text{ceiling} \{\log_2[3 \cdot (2^n - 1)^2 \cdot (P_e/P_o) + 1]\}.$$

as shown at box 34 in FIG. 2. The "ceiling" function shown in the previous equation represents determining the smallest integer which is larger than the quantity subject to the ceiling function. As will be further explained, the minimum resolution can be calculated in order to select an efficient number of digital bits to represent the error signal in its compressed form.

The error signal can then be compressed by another compression function $C_f(\cdot)$ to obtain a compressed error signal $I_{re}$:

$$I_{re} = C_f(I_e)$$

as shown at box 36 in FIG. 2. As will be further explained, the other compression function, $C_f(\cdot)$, can be selected from a number of different types of compression techniques. Depending on the minimum resolution requirement calculated previously, compression function $C_f(\cdot)$ may or may not be a different function than the compression function, $C_o(\cdot)$, used to compress the digitized signal 18.

The two compressed signals $I_c$ and $I_{re}$ when stored or transmitted together represent the compressed digital signal. The compressed signal $I_c$ and compressed error signal $I_{re}$ can be stored in the storage unit 10 or transmitted along the communication channel 12 (or both storage and transmission can be performed simultaneously). This is shown at box 38 in FIG. 2.

To recover the information in the digitized signal 18, the compressed signal $I_c$ can be retrieved from the storage unit 10 (or can be received at the remote end of the communication channel 12) and then conducted to the decompression processor 14, as shown at box 40 in FIG. 2. In the decompression processor 14, the recovered compressed signal $I_c$ can then be decompressed (using the same decompression function, $D_o(\cdot)$, used in the signal processor 8 to generate the locally decompressed signal) to obtain the decompressed signal $I_d$:

$$I_d = D_o(I_c)$$

as is shown at box 42 in FIG. 2.

Then the compressed error signal, $I_{re}$, can be retrieved (or received if the communication channel 12 is used) and can be decompressed using the decompression function, $D_f(\cdot)$, which substantially reverses the compression function, $C_f(\cdot)$, used to generate the compressed error signal, in order to obtain a decompressed error signal $I_{rd}$:

$$I_{rd} = D_f(I_{re})$$

as is shown at box 44 in FIG. 2.

$I_d$, the decompressed signal, and $I_{rd}$, the decompressed error signal, can be summed to generate a refined decompressed signal $I_{dd}$:

$$I_{dd} = I_d + I_{rd}$$

as is shown at box 46 in FIG. 2. The refined decompressed signal $I_{dd}$ serves as the recovered digitized signal 16. The final compression ratio for this process would be the harmonic mean of the compression ratios of the compression processes used to compress the signal and to compress the error signal.

The process of calculating the error signal $I_e$ and compressing it to generate the signal components ultimately stored or transmitted ($I_c$ and $I_{re}$) can be repeated if the error signal $I_e$ generated from the initial process is determined to be greater than a predetermined threshold. For example, in the signal processor 8, the recovered digitized signal 16 (as is generated by the decompression processor 14) can be generated as shown in the previous equation. A second error signal $I_{ee}$ can be calculated as the difference between the recovered digitized signal and the original signal as shown by the following expression:

$$I_{ee} = I_o - I_{dd}$$

The second error signal $I_{ee}$ can itself be compressed by another compression function $C_2(\cdot)$, which may or may not be the same as the other compression functions. Similarly, the locally recovered digitized signal can be compressed by an additional compression function. After transmission and/ or storage, a second recovered digitized signal can be generated as the sum of the decompressed second error signal $I_{ee}$ and the decompressed local recovered digital signal $I_{dd}$ as shown in the following expression:

$$I_{ddd} = I_{ee} + I_{dd}$$

The above process can be repeated any number times until the finally calculated error signal falls below the predetermined threshold.

It will be appreciated that the process described herein has some similarities to a form of signal compression known in the art as "pyramid coding". Pyramid coding uses successively higher resolution approximations of the signal, and generates an error signal which is the difference between the successive approximations and the original signal until the error signal falls below a predetermined threshold. Only the approximation is transmitted or stored. In the process of this invention, by contrast, the resolution of the signal, as it represents the sensor data input, is not changed, and the error signal is compressed and transmitted/stored along with the lossy compressed signal.

Having provided a generalized description of the method of the invention, an explanation of the theory of the process will now be provided. For example, the three previously described steps of preprocessing, quantization, and entropy coding embodied in the "compression function", can be represented by $C_o(\cdot)$, and an inverse of the compression function, or "decompression function", can be represented by $D_o(\cdot)$. $I_o$ represents the original digitized signal (18 in FIG. 1), and $I_c$ represents the compressed digitized signal, that is, the result after $I_o$ has undergone compression by the compression function $C_o(\cdot)$. $I_d$ represents the locally decompressed signal derived from $I_c$ after applying the decompression function, $D_o(\cdot)$, to the compressed signal $I_c$. The compressed and locally decompressed signals can be represented by the relationships: $I_c=C_o(I_o)$ and $I_d=D_o(I_o)$. It should be noted that in the case of lossless compression, i.e. where there is no quantization step, then the relationship $I_d=I_o$ is satisfied. This is, of course, not the case where lossy compression is used for $C_o(\cdot)$.

In the invention, the preprocessing step is preferably performed using a discrete wavelet transform. The wavelet transform can more economically represent the original signal than the digital bits making up the digitized signal 18 itself. See for example, D. L. Donoho, *Unconditional Bases are Optimal for Data Compression and for Statistical Estimation*, Applied and Computational Harmonic Analysis, vol. 1, no. 1, pp. 100–115, December 1993.

The effectiveness of any lossy compression scheme is generally related to the amount of signal "information" remaining in an error signal. The error signal, represented by $I_e$, is the arithmetic difference between the original signal $I_o$ and the decompressed signal $I_d$:

$$I_e = I_o - I_d \quad (1)$$

Information contained in the error signal may be determined by visual inspection of $I_e$ or more quantitatively by computing the total entropy, the power, or other autocorrelation statistics of the error signal. In this embodiment of the invention, the power in the error signal is calculated, but it is to be understood that the other content determination processes just described will also perform acceptably for purposes of this invention.

The problem of distortion may be simply restated as one of minimizing the magnitude of the error signal $I_e$. The magnitude of the error signal is related to its average power, represented by $P_e$. For a 2-dimensional signal having M×N pixels, the power in the error signal can be determined by the expression:

$$P_e = \Sigma [I_e(i,j)]^2/(M \times N) \quad (2)$$

where i=1, 2, . . . , M and j=1, 2, . . . , N. The ratio of the power in the error signal, $P_e$, to the power in the original signal, $P_o$, is usually expressed in decibels (dB) by the logarithmic formula:

$$dB_{e,o} = 10 \times \log_{10}(P_e/P_o) \quad (3)$$

Negative values of dB indicate that $P_e$ is smaller than $P_o$. For example, -100 dB indicates that $P_e=10^{-10} \times P_o$. $A_e$ and $A_o$ represent, respectively, measures of the error and original signal amplitudes. If the signal amplitude, rather than the signal power, is used to calculate dB, then the definition for dB is:

$$dB_{e,o} = 20 \times \log_{10}(A_e/A_o) \quad (4)$$

since $(A_e/A_o)^2 = P_e/P_o$. When the dB value is -100, for example, then $A_e=10^{-5} \times A_o$.

The effect of truncating an n-bit data word, or number, (where a sign bit is not included in the word) to n-m bits is equivalent to setting the m least significant bits equal to zero. Generally, the m least significant bits in an n-bit word representing any particular signal are serially highly uncorrelated and are approximately uniformly distributed. Therefore truncation may be viewed statistically as equivalent to subtracting an m-bit uniformly distributed random number from the original n-bit number. Truncation will therefore introduce noise, the power of which is approximately equal to the average power in such an m-bit number, this "noise power" being represented by $P_m$. The noise power can be shown to be equal to: $P_m=(2^m-1)^2/3$. The noise power may be compared to the maximum power $P_n$ in the n-bit number which is $P_n=(2^n-1)^2$. Therefore, the relative noise level in dB can be determined by the expression:

$$db_{m,n} = 10 \times [\log_{10}((2^m-1)^2/(2^n-1)^2/3)]. \quad (5)$$

Using equation (5) and a value for n, it is possible to determine a value for m, and thereby determined the minimum number of bits necessary to represent values in a broad band noise distortion signal having a power $P_e$ which was induced by the effect of quantization in the process of lossy compression.

For example, if n=22 and $P_e$=-65 dB, then m should be greater than or equal to 12. In other words, if the original signal, $I_o$, could be represented with 22-bit words, and the power $P_e$ in the error signal $I_e$ was equal to -65 dB, then the error signal should be represented with at least 12-bit words. A solution can be found by setting $dB_{m,n}=dB_{e,o}$ and then solving for the smallest value of m which satisfies that relationship from:

$$m = \text{ceiling} \{\log_2[3 \times (2^n-1)^2 \cdot (P_e/P_o) - 1]\}. \quad (6)$$

In this way it is possible to effectively represent the error signal $I_e$ with fewer bits in each word than are used to represent the original signal $I_o$.

The error signal $I_e$ will generally contain a residual component of the original signal, this residual component represented by $I_r$, plus a noise component, $I_n$. The error signal $I_e$ is uncorrelated to the original signal $I_o$, and can be represented by the expression:

$$I_e = I_r + I_n. \quad (7)$$

If the error signal $I_e$ can be processed to approximately separate out the two components then the recovered residual signal $I_r$ can be combined with the decompressed signal $I_d$ to better approximate the original signal $I_o$. An exact separation of the error signal components is not generally possible, but an approximation may be obtained using the discrete wavelet transform. Here a separation occurs in terms of wavelet coefficient amplitudes with a larger number of smaller coefficient values being attributed to the noise component $I_n$, and a smaller number of larger coefficient values being attributed to the residual component $I_r$.

Using the lossy compressed signal $I_c$ and its associated error signal $I_e$, then the original signal $I_o$ can be reconstructed from equation (1) by the expression:

$$I_o = I_d + I_e \quad (8)$$

where $I_d=D_o(I_c)$ and $D_o(\cdot)$ represents the decompression function defined earlier. This dual signal technique would be impractical unless the error signal, $I_e$, could also be compressed. There are two general methods which can be used to compress the error signal, either lossless or lossy compression. If the lossy compression process $C_o(\cdot)$ works well, meaning that the value of the error signal is close to zero, then $I_e$ should be very difficult to losslessly compress because of its high entropy or "random" nature.

The lossy compression of $I_e$ can be performed as simply as quantizing to a fixed but small number of bits, for example 8 bits (or one byte) per value of $I_e$. Quantization could also be used in combination with lossless entropy encoding. The effectiveness of this combination would depend on the amount of coherent signal information remaining in $I_e$ in the form of $I_r$ as defined in equation (7). The use of a wavelet transform preprocessing step on $I_e$ can be very effective in aiding any subsequent lossy compression technique. For this refinement step, a different wavelet basis set might be selected either to encode the residual signal $I_r$ present in the error signal $I_e$ or the noise signal $I_n$ itself. Noise encoding can be performed with a fractal-like or noisy wavelet basis as described in R. A. Gopinath et al, *On Cosine-Modulated Wavelet Orthonormal Bases*, IEEE Transactions on Image Processing, vol. 4, no. 2, February 1992. Alternatively a predictive chaotic model can be used such as one described in A. S. Weigend et al, *Time Series Prediction*, Addison-Wesley, New York (1994). Fractal compression can also be used, as described in M. F. Barnsley and A. D. Sloan, *A Better Way to Compress Images*, BYTE Magazine, January 1988, pp. 215–223.

In any event, it is possible to substantially reduce the compression induced noise $I_n$ on the locally decompressed signal $I_d$ by calculating a companion signal $I_{re}=C_f(I_e)$. The final recovered digital signal can be derived from the expression:

$$I_{dd}=I_d+D_f(I_{re}), \quad (9)$$

$D_o(\cdot)$ and $D_f(\cdot)$ may, of course, be different from each other. They represent, respectively, the decompression functions corresponding to $C_o(\cdot)$ and $C_f(\cdot)$. The result of the process of the invention is that $I_{dd}$ is a more accurate representation of $I_o$ than is $I_d$. $I_d$ represents not only the locally decompressed signal generated in the signal processor 8, but would also represent the recovered digital signal when using compression/decompression known in the prior art, since it represents a signal having only undergone lossy compression and its corresponding decompression. The improvement provided by the invention depends on how closely the signals $D_f(I_{re})$ and $I_e$ match, and would increase both the compression/decompression work and the total compressed signal size, and thus reduce the final effective compression ratio.

Those skilled in the art will readily devise other embodiments of this invention which do not depart from the spirit of the invention as disclosed herein. Accordingly, the invention should be limited in scope only by the attached claims.

What is claimed is:

1. A method of compressing signals for transmission and storage, comprising:

lossy compressing an original signal to generate a lossy compressed signal;

decompressing said lossy compressed signal to generate a local lossy decompressed signal;

calculating an error signal be determining a difference between said original signal and said local lossy decompressed signal;

determining an autocorrelation characteristic of said original signal and of said error signal;

determining a minimum resolution for quantizing said error signal from a ratio of said autocorrelation characteristic of said original signal with respect to said autocorrelation characteristic of said error signal;

lossy compressing said error signal, said step of lossy compressing said error signal including quantizing to at least said minimum resolution;

recovering said lossy compressed error signal and said lossy compressed signal;

decompressing said lossy compressed signal and said lossy compressed error signal; and summing said decompressed lossy compressed signal and said decompressed lossy compressed error signal to generate a recovered original signal.

2. The method as defined in claim 1 wherein said step of lossy compression of said original signals comprises blocked discrete cosine transforming.

3. The method as defined in claim 1 wherein said step of lossy compression of said original signals comprises discrete wavelet transforming.

4. The method as defined in claim 1 wherein said step of lossy compression of said original signals comprises quantization.

5. The method as defined in claim 1 wherein said step of lossy compression of said error signal comprises quantizing to a fixed number of bits.

6. The method as defined in claim 1 wherein said step of lossy compression of said error signal comprises quantizing to a fixed number of bits in combination with fixed entropy encoding.

7. The method as defined in claim 1 wherein said autocorrelation characteristic comprises power.

8. The method as defined in claim 1 wherein said autocorrelation characteristic comprises amplitude.

9. A method of compressing signals for transmission and storage, comprising:

lossy compressing an original signal to generate a lossy compressed signal;

decompressing said lossy compressed signal to generate a local lossy decompressed signal;

calculating an error signal be determining a difference between said original signal and said local lossy decompressed signal;

lossy compressing said error signal;

recovering said lossy compressed error signal and said lossy compressed signal;

decompressing said lossy compressed signal and said lossy compressed error signal; and summing said decompressed lossy compressed signal and said decompressed lossy compressed error signal to generate a recovered original signal.

10. The method as defined in claim 9 further comprising:

determining an autocorrelation characteristic of said original signal and of said error signal;

determining a minimum resolution for quantizing said error signal from a ratio of said autocorrelation characteristic of said original signal with respect to said autocorrelation characteristic of said error signal; and wherein said step of lossy compressing said error signal includes quantizing to at least said minimum resolution.

11. The method as defined in claim 10 wherein said step of lossy compression of said error signal comprises quantizing to a fixed number of bits.

12. The method as defined in claim 10 wherein said step of lossy compression of said error signal comprises quantizing to a fixed number of bits in combination with fixed entropy encoding.

13. The method as defined in claim 9 wherein said step of lossy compression of said original signals comprises blocked discrete cosine transforming.

14. The method as defined in claim 9 wherein said step of lossy compression of said original signals comprises discrete wavelet transforming.

15. The method as defined in claim 9 wherein said step of lossy compression of said original signals comprises quantization.

* * * * *